(12) United States Patent
Yu et al.

(10) Patent No.: US 11,910,536 B2
(45) Date of Patent: Feb. 20, 2024

(54) DIRECT-INK-WRITING METHOD FOR PRINTING STRAIN GAUGE ARRAY CIRCUIT BASED ON INSULATING STRIPS

(71) Applicant: JIANGNAN UNIVERSITY, Wuxi (CN)

(72) Inventors: Peishi Yu, Wuxi (CN); Junhua Zhao, Wuxi (CN); Lixin Qi, Wuxi (CN); Zhiyang Guo, Wuxi (CN); Yu Liu, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 183 days.

(21) Appl. No.: 17/702,199

(22) Filed: Mar. 23, 2022

(65) Prior Publication Data

US 2022/0217849 A1     Jul. 7, 2022

Related U.S. Application Data

(63) Continuation of application No. PCT/CN2021/128570, filed on Nov. 4, 2021.

(51) Int. Cl.
*H05K 3/12* (2006.01)
*G01L 1/22* (2006.01)
*B33Y 10/00* (2015.01)

(52) U.S. Cl.
CPC ............ *H05K 3/125* (2013.01); *G01L 1/2287* (2013.01); *B33Y 10/00* (2014.12)

(58) Field of Classification Search
CPC ........ H05K 3/125; G01L 1/2287; B33Y 10/00
See application file for complete search history.

(56) References Cited

U.S. PATENT DOCUMENTS

| 8,695,441 B2* | 4/2014 | Kim | G01L 1/2293 |
| | | | 73/862.045 |
| 10,572,752 B2* | 2/2020 | Liu | G06V 40/1318 |
| 10,859,450 B2* | 12/2020 | Oh | G01L 1/2287 |
| 11,281,327 B2* | 3/2022 | Song | G06F 3/0446 |
| 2005/0277350 A1 | 12/2005 | Smith et al. | |

(Continued)

FOREIGN PATENT DOCUMENTS

| CN | 202306501 U | 7/2012 |
| CN | 105336582 A | 2/2016 |

(Continued)

*Primary Examiner* — Kyung S Lee
(74) *Attorney, Agent, or Firm* — SZDC Law PC

(57) ABSTRACT

In a direct-ink-writing (DIW) method for printing a strain gauge array circuit, several insulating strips are printed on the upper layer of the first circuit layer after the first circuit layer has been printed and cured, and the second circuit layer is then printed at the insulating strips. The functional layer of a strain gauge is printed and covered thereon without contacting the insulating strips; the head and tail electrodes of the functional layer are respectively connected to two layers of circuit layers; and finally, a layer of insulating material is printed for encapsulation. DIW is used to complete the whole printing. A new insulating method is used in a cross part of two silver lines of a row-column compound circuit. The local glue dispensing is changed to printing the insulating strips in routing regions, and ensures the strain transmission efficiency from the strain gauge substrate to the functional layer.

3 Claims, 4 Drawing Sheets

(56) References Cited

U.S. PATENT DOCUMENTS

| | | | |
|---|---|---|---|
| 2006/0250534 A1* | 11/2006 | Kutscher | H10N 70/881 |
| | | | 257/E45.002 |
| 2019/0205684 A1* | 7/2019 | Liu | H01L 27/14623 |
| 2020/0183564 A1 | 6/2020 | Song et al. | |

FOREIGN PATENT DOCUMENTS

| | | |
|---|---|---|
| CN | 106248266 A | 12/2016 |
| CN | 108108717 A | 6/2018 |
| CN | 108196715 A | 6/2018 |
| CN | 110636708 A | 12/2019 |
| CN | 112135443 A | 12/2020 |
| KR | 20120099938 A | 9/2012 |
| WO | 9811500 A1 | 3/1998 |

\* cited by examiner

DIRECT-INK-WRITING METHOD FOR PRINTING STRAIN GAUGE ARRAY CIRCUIT BASED ON INSULATING STRIPS

This application is a Continuation Application of PCT/CN2021/128570, filed on Nov. 4, 2021, which claims priority to Chinese Patent Application No. 202011000665.4, filed on Sep. 22, 2020, which is incorporated by reference for all purposes as if fully set forth herein.

TECHNICAL FIELD

The present invention relates to the field of strain gauges and the field of 3D printing layered circuits, and in particular, to a direct-ink-writing (DIW) method for printing a strain gauge array circuit based on insulating strips.

BACKGROUND

A resistive strain gauge is a sensing device that converts a strain change on a measured object into an electric signal. A single resistive strain gauge can only measure a strain of a single point. Therefore, in order to realize the measurement of strains of a plurality of points, it is necessary to perform array design to form a strain gauge array circuit.

A matrix circuit provides an idea for the design of the strain gauge array circuit. A horizontal circuit and a longitudinal circuit cross each other. Each cross position forms a measurement point, and the electrical signal of each measurement point can be obtained in the form of row scanning or column scanning. However, the matrix circuit inevitably has the problem of cross insulation between the horizontal circuit and the longitudinal circuit. In order to ensure the insulation between the circuits, the current practice is usually to bridge and glue the cross position between the horizontal circuit and the longitudinal circuit during printing of a first layer of line, but this will generate a raised step at a glued part, which will affect the printing accuracy of a second layer of line and will easily cause an open circuit under a tensile stress.

SUMMARY

Technical Problem

The matrix circuit inevitably has the problem of cross insulation between the horizontal circuit and the longitudinal circuit. In order to ensure the insulation between the circuits, the current practice is usually to bridge and glue the cross position between the horizontal circuit and the longitudinal circuit during printing of a first layer of line, but this will generate a raised step at a glued part, which will affect the printing accuracy of a second layer of line and will easily cause an open circuit under a tensile stress.

Technical Solution

In view of the above-mentioned problems and technical requirements, the inventors have provided a DIW method for printing a strain gauge array circuit based on insulating strips. The technical solution of the present invention is as follows:

A DIW method for printing a strain gauge array circuit based on insulating strips, the method includes:
forming a first insulating layer by DIW printing on a planar substrate using an insulating material;
forming m parallel spaced first silver lines by DIW printing on the insulating layer using conductive silver paste to form a first circuit layer, wherein one end of each first silver line includes an electrode lead-out end;
forming n parallel spaced insulating strips by DIW printing on the first circuit layer using an insulating material to form a second insulating layer, wherein the insulating strips are perpendicular to the first silver lines and continuously cover m first silver lines in a region where the insulating strips are located, and the first silver lines in a region between two adjacent insulating strips are exposed with respect to the second insulating layer;
respectively printing a second silver line at each insulating strip of the second insulating layer using the conductive silver paste to form a second circuit layer, wherein each second silver line respectively includes a main line and m branches connected thereto, and each second silver line is respectively spaced apart; a main line of each second silver line is respectively located on the corresponding insulating strip, is perpendicular to the first silver line, and has one end including an electrode lead-out end; a part of each branch of the second silver line is located on the corresponding insulating strip, and the other part of each branch is outside the insulating strip and located on the first insulating layer;
forming m*n strain gauge head electrodes, m*n strain gauge tail electrodes, and m*n connecting wires by DIW printing using conductive carbon paste to form a functional layer, wherein one strain gauge head electrode is respectively printed at a region of each first silver line that is exposed between two adjacent insulating strips and a region that is exposed between the electrode lead-out end and the adjacent insulating strip; one strain gauge tail electrode is respectively printed at the tail end of each branch of each second silver line on the second circuit layer; each strain gauge head electrode corresponds to one strain gauge tail electrode and is connected to the strain gauge tail electrode through a connecting wire;
printing and forming a third insulating layer using an insulating material to complete encapsulation, wherein the third insulating layer covers other regions except the electrode lead-out ends of the first circuit layer, the electrode lead-out ends of the second circuit layer, and the strain gauge head electrodes and the strain gauge tail electrodes on the functional layer.

According to a further technical solution, each strain gauge head electrode, each strain gauge tail electrode and each connecting wire used for forming the functional layer are printed on the first insulating layer and do not contact the insulating strips.

According to a further technical solution, when the second circuit layer is printed, the same branch of the same second silver line is DIW printed twice.

According to a further technical solution, the method further includes:
after a silver paste material is stirred using a planetary stirrer at 2000 rpm for 3 min, putting the conductive silver paste into a printing syringe, and performing centrifugation at 3000 rpm for 3 min to remove bubbles from the silver paste material, thus preparing the conductive silver paste used for printing and forming the first circuit layer and the second circuit layer.

According to a further technical solution, when the first circuit layer and the second circuit layer are printed and formed using the conductive silver paste, the conductive silver paste is accommodated in the printing syringe for printing; after the conductive silver paste is printed, curing is completed to form the corresponding circuit layers; the viscosity of the conductive silver paste is 10000 cP; the inner diameter of a printing needle head of the printing syringe is 110 μm; a printing line distance is 100 μm; a printing speed is 3 mm/s; an extrusion air pressure is 0.65 MPa; and during curing, an oven is used for drying at 70° C. for 15-30 min.

According to a further technical solution, when the first insulating layer, the second insulating layer, and the third insulating layer are printed and formed using an insulating material, the insulating material is accommodated in a printing syringe for printing; after the insulating material is printed, curing is completed to form the corresponding insulating layers; the inner diameter of a printing needle head of the printing syringe is 110 μm; a printing line distance is 100 μm; a printing speed is 10 mm/s; an extrusion air pressure is 0.1 MPa; and during curing, curing is performed under a UV curing lamp for 10 min.

According to a further technical solution, the method further includes:

after a carbon paste material is stirred using a planetary stirrer at 2000 rpm for 2 min, putting the carbon paste material into a printing syringe, and performing centrifugation at 3000 rpm for 3 min to remove bubbles from the carbon paste material, thus preparing the conductive carbon paste used for printing and forming the functional layer.

According to a further technical solution, when the functional layer is printed and formed using the conductive carbon paste, the conductive carbon paste is accommodated in a printing syringe for printing; the viscosity of the conductive carbon paste is 30000 cP; the inner diameter of a printing needle head of the printing syringe is 110 μm; a printing line distance is 100 μm; a printing speed is 10 mm/s; and an extrusion air pressure is 0.65 MPa.

According to a further technical solution, when the functional layer is printed and formed using the conductive carbon paste, after the conductive carbon paste is printed, an oven is used for drying at 120° C. for 15 min or the conductive carbon paste is placed at a room temperature for 3 days to complete curing, thus forming the functional layer.

Beneficial Effects

The present application discloses a DIW method for printing a strain gauge array circuit based on insulating strips. The technology can solve the problem of insulation of a cross part of two silver lines of a row-column composite circuit. This is different from the conventional way of dispensing glue at the cross part. In the present invention, several insulating strips are printed on the upper layer of the first circuit layer after the first circuit layer has been printed and cured, and the second circuit layer is then printed. The functional layer of a strain gauge is printed and covered thereon without contacting the insulating strips; the head and tail electrodes of the functional layer are respectively connected to two layers of horizontal and longitudinal circuits; and finally, a layer of insulating material is printed for encapsulation. In this process, DIW is used to complete the whole printing, which is convenient and simple. The printing of an array strain gauge can be effectively completed, and the stability of measurement can be ensured. A new insulating method is used in the cross part of the array circuit. The local glue dispensing is changed to printing the insulating strips in routing regions, which solves the problems of poor relevant position accuracy caused by the local glue dispensing, an excessive positioning error of the cylinder in the process of multiple curing and printing and mutual interference between the horizontal and longitudinal circuits, and ensures the strain transmission efficiency from the strain gauge substrate to the functional layer.

DETAILED DESCRIPTION

Reference will now be made in detail below to the specific implementations of the present invention in the accompanying drawings.

Figure 1:
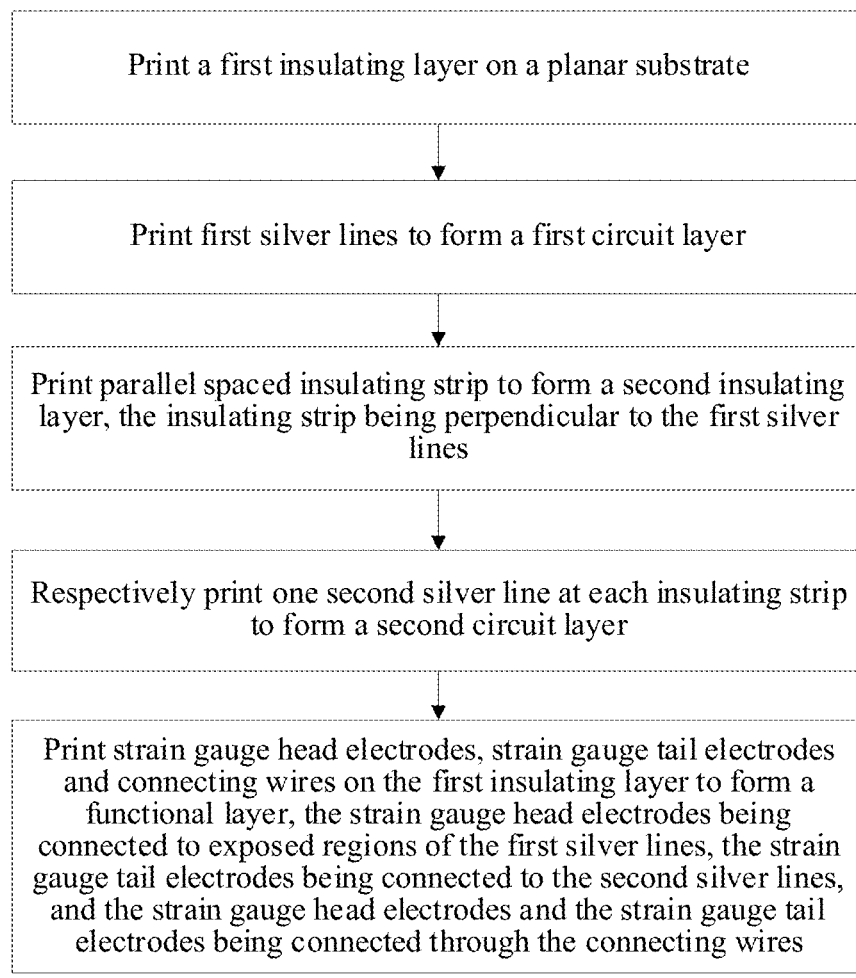
FIG. 1 is a flow chart of a novel DIW method for printing disclosed in the present application.
Figure 2:
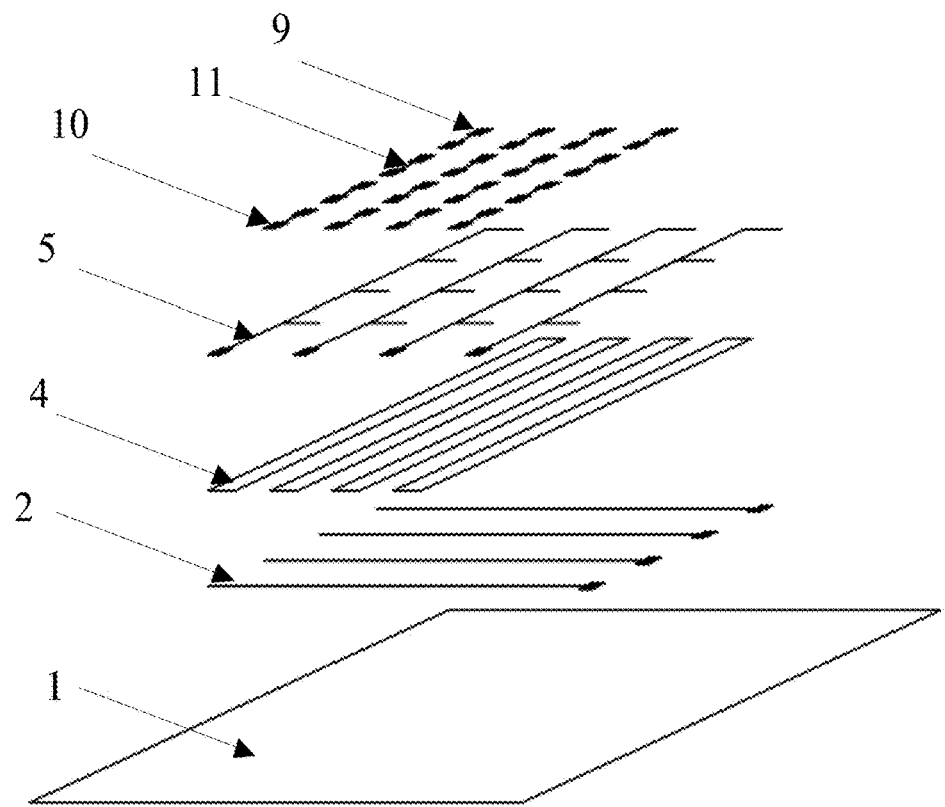
FIG. 2 is a schematic exploded diagram of each layer of cascaded printing in a method of the present application.

The present application discloses a DIW method for printing a strain gauge array circuit based on insulating strips. Referring to the flow chart shown in FIG. 1 and the schematic diagram of cascaded printing shown in FIG. 2, the method includes the following steps:

In step S1, an insulating material is used for DIW printing on a planar substrate to form a first insulating layer 1. Before the first insulating layer 1 is printed, the planar substrate is firstly sufficiently cleaned with anhydrous ethanol and absorbent cotton, and then printing is carried out.

The insulating material used in the present application is an ANYCUBIC® material. Before formal printing, a certain amount of the ANYCUBIC® material is put into an opaque printing syringe; the printing syringe is connected to an air pressure control valve, and is clamped on a numerical control three-axis motion platform to perform printing on the planar substrate in a 3D printing and DIW manner. After debugging, with regard to this type of the ANYCUBIC® material, in the present application, it is set that the inner diameter of a printing needle head of the printing syringe is 110 μm, a printing line distance is 100 μm, a printing speed is 10 mm/s, and an extrusion air pressure is 0.1 MPa. At this time, higher printing quality can be achieved. After the insulating material is printed, the insulating material is cured under a UV curing lamp for 10 min, and the first insulating layer 1 is finally formed. A thickness of the first insulating layer 1 formed in the present application is in a range of 45-75 μm. The printing of this layer effectively ensures the planarity of the first insulating layer and ensures insulation between a printed circuit and the planar substrate.

Figure 3:
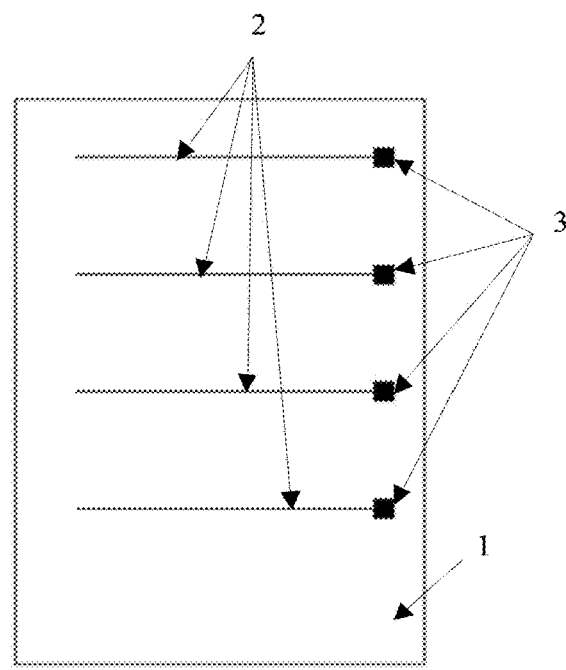
FIG. 3 is a structural diagram after printing of a first circuit layer is completed in the present application.

In step S2, conductive silver paste is used for forming m parallel spaced first silver lines 2 by DIW printing on the insulating layer to form a first circuit layer, wherein one end of each first silver line 2 includes an electrode lead-out end 3. As shown in FIG. 3, m=4 and the first silver line 2 being a transverse circuit is as an example. The size of the electrode lead-out end 3 at the tail end of the first silver line 2 in the present application is 1 mm×1 mm.

Before the use of the conductive silver paste for printing, a conductive silver paste with high conductivity used in the present application needs to be prepared first. A preparation method includes: after a silver paste material (XRK-8000H) is stirred using a planetary stirrer at 2000 rpm for 3 min, putting the conductive silver paste into a printing syringe, and performing centrifugation at 3000 rpm for 3 min to remove bubbles from the silver paste material, thus preparing the conductive silver paste used for printing and forming the first circuit layer and the second circuit layer. The step of preparing the conductive silver paste may be performed before the printing of the circuit layer, or may be performed before the formal printing, i.e., the step S1, which is not limited in the present application.

When the first circuit layer is printed, a certain amount of the conductive silver paste is put into an opaque printing syringe. The printing syringe is connected to an air pressure control valve, and is clamped on a numerical control three-axis motion platform to perform printing in a 3D printing and DIW manner. After debugging, with regard to the conductive silver paste with viscosity of 10000 cP, in the present application, it is set that the inner diameter of the printing needle head of the printing syringe is 110 μm, a printing line distance is 100 μm, a printing speed is 3 mm/s, and an extrusion air pressure is 0.65 MPa. At this time, higher printing quality can be achieved. After the conductive silver paste is printed, an oven is used for drying at 70° C. for 15 to 30 min to finally form the first circuit layer.

Figure 4:
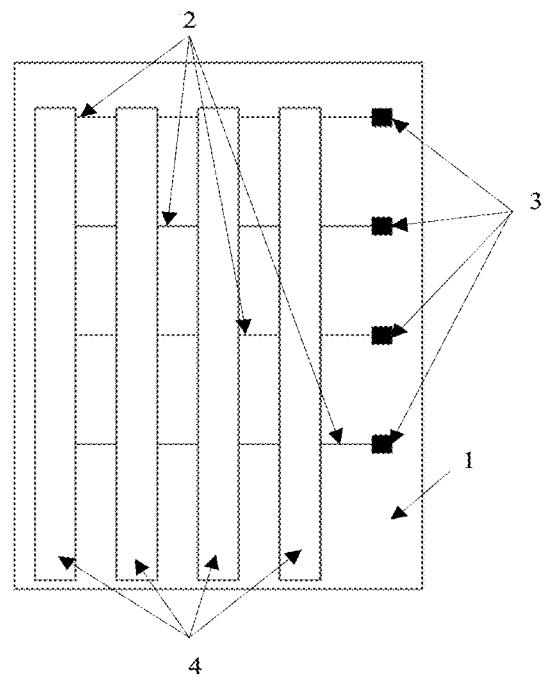
FIG. 4 is a structural diagram after printing of a second insulating layer is completed in the present application.

In step S3, an insulating material is used for forming n parallel spaced insulating strips 4 by DIW printing on the first circuit layer to form a second insulating layer, wherein the insulating strips 4 are perpendicular to the first silver lines 2 and continuously cover the m first silver lines 2 in a region where the insulating strips 4 are located. During printing of the insulating strips 4, the insulating material, the printing steps, the printing parameters and the curing parameters used are the same as those for printing the first insulating layer 1 in the step S1, and no repeated descriptions are made in the present application. In actual operation, the values of m and n are generally the same, as shown in FIG. 4, m=n=4 is taken as an example. The first silver line 2 in a region between two adjacent insulating strips 4 is exposed with respect to the second insulating layer. The electrode lead-out end 3 at one end of the first silver line 2 is also exposed with respect to the second insulating layer. The first silver line 2 in a region between the electrode lead-out end 3 and the adjacent insulating strip is also exposed with respect to the second insulating layer.

A length of the insulating strip 4 is greater than a total width formed by the m first silver lines 2, and is greater than a length of the second silver lines to be printed subsequently. The specific shape of the insulating strip 4 is not limited in the present application. In a conventional case, it is a rectangular tape structure. In the present application, when the length of the second silver lines is 21 mm, the size of each insulating strip 4 is 2 mm×26 mm.

In step S4, the conductive silver paste is used to respectively print a second silver line 5 at each insulating strip 4 of the second insulating layer to form a second circuit layer, wherein each second silver line 5 respectively includes a main line 6 and m branches 7 connected thereto, and each second silver line 5 is respectively spaced apart and not connected. The main line 6 of each second silver line 5 is respectively located on the corresponding insulating strip 4, is perpendicular to the first silver line 2, and has one end including an electrode lead-out end 8. The width of the electrode lead-out end 8 is less than the width of the insulating strip 4 so as to be completely located on the insulating strip 4, and each branch 7 of the second silver line 5 is partially located on the corresponding insulating strip 4 and partially located outside the insulating strip 4 and on the first insulating layer 1. In addition, in the present application, during printing of the second circuit layer, DIW printing is repeatedly performed twice on the same branch 7 of the same second silver line 5, so as to ensure that the circuits can be effectively connected.

Figure 5:
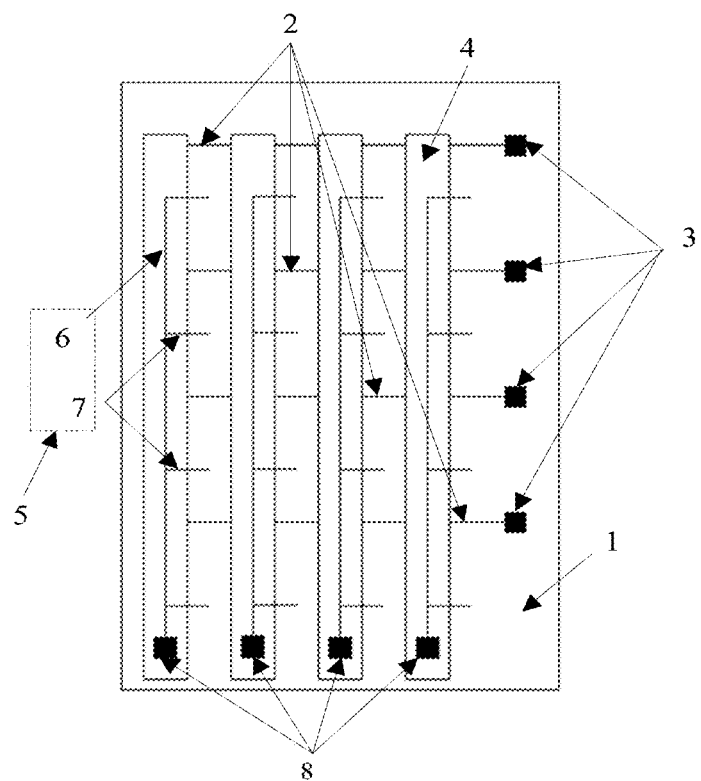
FIG. 5 is a structural diagram after printing of a second circuit layer is completed in the present application.

As shown in FIG. 5, on the basis that the first silver lines 2 are horizontal lines, n=4, the second circuit layer has four second silver lines 5 whose main lines are longitudinal. In the present application, the length of the main line 6 of the second silver line 5 is 21 mm. One branch 7 is provided on the main line at an interval of 6.5 mm. Each branch has a length of 2 mm. The size of the electrode lead-out end 8 at one end of the main line 6 is 1 mm×1 mm, and the width is less than the width of the insulating strip 4 by 2 mm. During printing of the second circuit layer, the conductive silver paste, the printing step, the printing parameters, and the curing parameters used are all the same as those for printing of the first circuit layer in the step S2, and the present application does not make repeated descriptions.

Figure 6:
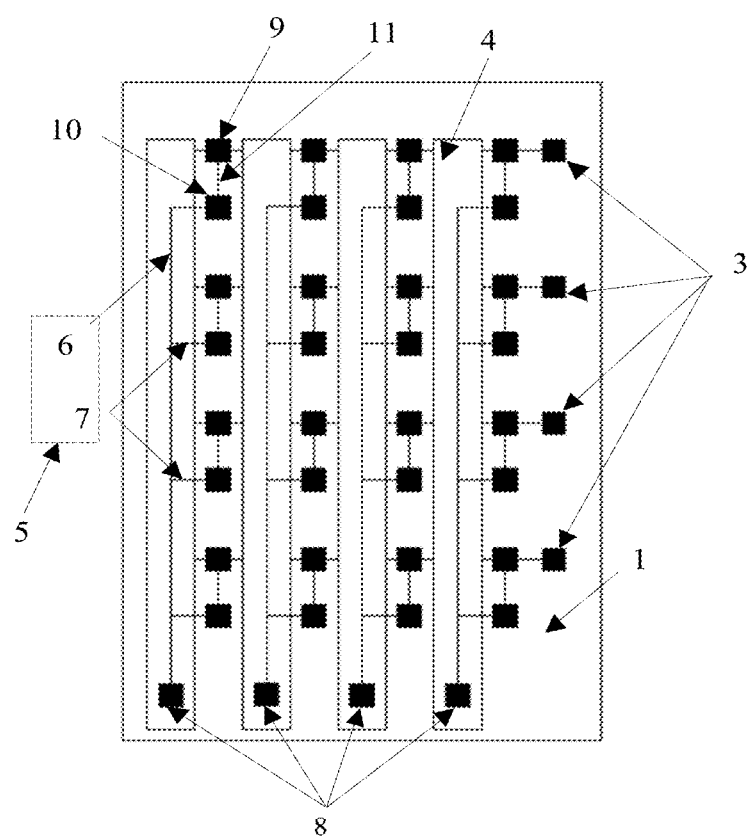
FIG. 6 is a structural diagram after printing of a functional layer is completed in the present application.

In step S5, conductive carbon paste is used for forming m*n strain gauge head electrodes 9, m*n strain gauge tail electrodes 10 and m*n connecting wires 11 by DIW printing to form a functional layer, referring to FIG. 6. One strain gauge head electrode 9 is respectively printed at a region of each first silver line 2 that is exposed between two adjacent insulating strips 4 and a region that is exposed between the electrode lead-out end 3 of the first silver line 2 and the adjacent insulating strip 4; one strain gauge tail electrode 10 is respectively printed at the tail end of each branch of each second silver line 5 on the second circuit layer; each strain gauge head electrode 9 corresponds to one strain gauge tail electrode 10 and is connected to the strain gauge tail electrode through a connecting wire 11. Each strain gauge head electrode 9, each strain gauge tail electrode 10 and each connecting wire 11 are printed on the first insulating layer 1 without contacting the insulating strips 4, so that the entire functional layer is printed on the first insulating layer 1 without contacting the insulating strip. In the present application, the sizes of the strain gauge head electrode 9 and the strain gauge tail electrode 10 are both 1 mm×1 mm, and the length of the connecting wire 11 is 1.5 mm.

Before the use of the conductive carbon paste for printing, a conductive carbon paste with high conductivity used in the present application needs to be prepared first. A preparation method includes: after a carbon paste material (CH-8, JEL-CON®) is stirred using a planetary stirrer at 2000 rpm for 2 min, putting the carbon paste material into a printing syringe, and performing centrifugation at 3000 rpm for 3 min to remove bubbles from the carbon paste material, thus preparing the conductive carbon paste used for printing and forming the functional layer. The step of preparing the conductive carbon paste may be performed before the printing of the functional layer, or may be performed before the formal printing, i.e., the step S1, which is not limited in the present application.

When the functional layer is printed, a certain amount of the conductive carbon paste is put into an opaque printing syringe. The printing syringe is connected to an air pressure control valve, and is clamped on a numerical control three-axis motion platform to perform printing in a 3D printing and DIW manner. After debugging, with regard to the conductive carbon paste with viscosity of 30000 cP, the inner diameter of the printing needle head of the printing syringe is 110 μm; a printing line distance is 100 μm; a printing speed is 10 mm/s; and an extrusion air pressure is 0.65 MPa. At this time, higher printing quality can be achieved. After the conductive carbon paste is used, an oven is used for drying at 120° C. for 15 min or the conductive carbon paste is placed at a room temperature for 3 days to complete curing, thus forming the functional layer.

In step S6, an insulating material is used for printing and forming a third insulating layer to complete encapsulation, wherein the third insulating layer covers other regions except the electrode lead-out ends 3 of the first circuit layer, the electrode lead-out ends 8 of the second circuit layer, and the strain gauge head electrodes 9 and the strain gauge tail electrodes 10 on the functional layer. During printing of the third insulating layer, the insulating material, the printing step, the printing parameters, and the curing parameters used are all the same as those for printing of the first insulating layer 1 in the step S1, and the present application does not make repeated descriptions. The third insulating layer is an encapsulation layer to ensure the working performance of a sample, and the electrode lead-out ends on the two circuit layers and all the electrodes on the functional layer are exposed with respect to the third insulating layer, so as to facilitate outward lead measurement.

The above descriptions are merely preferred implementations of the present application, and the present invention is not limited to the above embodiments. It can be understood that other improvements and changes directly derived or associated by those skilled in the art, without departing from the spirit and conception of the present invention, shall all fall within the protection scope of the present invention.

What is claimed is:

1. A direct-ink-writing (DIW) method for printing a strain gauge array circuit based on insulating strips, the method comprising:
   forming a first insulating layer by DIW printing on a planar substrate using an insulating material;
   forming m parallel spaced first silver lines by DIW printing on the insulating layer using conductive silver paste to form a first circuit layer, wherein one end of each first silver line comprises an electrode lead-out end;
   forming n parallel spaced insulating strips by DIW printing on the first circuit layer using an insulating material to form a second insulating layer, wherein the insulating strips are perpendicular to the first silver lines and continuously cover m first silver lines in a region where the insulating strips are located, and the first silver lines in a region between two adjacent insulating strips are exposed with respect to the second insulating layer;
   respectively printing a second silver line at each insulating strip of the second insulating layer using the conductive silver paste to form a second circuit layer, wherein each second silver line respectively comprises a main line and m branches connected thereto, and each second silver line is respectively spaced apart; a main line of each second silver line is respectively located on the corresponding insulating strip, is perpendicular to the first silver line, and has one end comprising an electrode lead-out end; a part of each branch of the second silver line is located on the corresponding insulating strip, and the other part of each branch is outside the insulating strip and located on the first insulating layer;
   forming m*n strain gauge head electrodes, m*n strain gauge tail electrodes, and m*n connecting wires by DIW printing using conductive carbon paste to form a functional layer, wherein one strain gauge head electrode is respectively printed at a region of each first silver line that is exposed between two adjacent insulating strips and a region that is exposed between the electrode lead-out end and the adjacent insulating strip; one strain gauge tail electrode is respectively printed at the tail end of each branch of each second silver line on the second circuit layer; each strain gauge head electrode corresponds to one strain gauge tail electrode and is connected to the strain gauge tail electrode through a connecting wire;
   printing and forming a third insulating layer using an insulating material to complete encapsulation, wherein the third insulating layer covers other regions except the electrode lead-out ends of the first circuit layer, the electrode lead-out ends of the second circuit layer, and the strain gauge head electrodes and the strain gauge tail electrodes on the functional layer.

2. The method according to claim 1, wherein each strain gauge head electrode, each strain gauge tail electrode and each connecting wire used for forming the functional layer are printed on the first insulating layer and do not contact the insulating strips.

3. The method according to claim 1, wherein when the second circuit layer is printed, the same branch of the same second silver line is DIW printed twice.

* * * * *